United States Patent

Takeuchi et al.

Patent Number: 6,130,446
Date of Patent: Oct. 10, 2000

[54] ELECTRODE OF N-TYPE NITRIDIDE SEMICONDUCTOR, SEMICONDUCTOR DEVICE HAVING THE ELECTRODE, AND METHOD OF FABRICATING THE SAME

[75] Inventors: Kunio Takeuchi, Jyoyo; Nobuhiko Hayashi, Osaka; Yasuhiko Nomura, Moriguchi; Kouji Tominaga, Hirakata, all of Japan

[73] Assignee: Sanyo Electric Co., Ltd., Osaka, Japan

[21] Appl. No.: 09/113,301

[22] Filed: Jul. 10, 1998

[30] Foreign Application Priority Data

Jul. 16, 1997 [JP] Japan .................................. 9-190947

[51] Int. Cl.[7] ............................................... H01L 29/43
[52] U.S. Cl. ............................................. 257/99; 257/754
[58] Field of Search ............................. 257/99, 98, 94, 257/754

[56] References Cited

U.S. PATENT DOCUMENTS 5,061,985 10/1991 Meguro et al. ............................. 357/68
5,760,423 6/1998 Kamakura et al. ......................... 257/99

OTHER PUBLICATIONS

Abstract of Japanese Patent Publ. No. 07094782; dated Apr. 7, 1995.

Abstract of Japanese Patent Publ. No. 07254733; dated Oct. 3, 1995.

"Investigation of the Mechanism for Ohmic Contact Formation in Al and Ti/Al Contacts to n-type GaN", Appl. Phys. Lett. 70(1), Jan. 6, 1997, pp. 57–59.

*Primary Examiner*—David Hardy
*Attorney, Agent, or Firm*—Arent Fox Kintner Plotkin and Kahn

[57] ABSTRACT

The present invention provides an electrode making good ohmic contact with an n-type nitride semiconductor without requiring heat treatment at high temperature, wherein an aluminum layer, a silicon layer, a nickel layer and a gold layer are laminated in this order on an n-type gallium nitride based semiconductor, to form an n-type electrode.

18 Claims, 3 Drawing Sheets

ELECTRODE OF N-TYPE NITRIDIDE SEMICONDUCTOR, SEMICONDUCTOR DEVICE HAVING THE ELECTRODE, AND METHOD OF FABRICATING THE SAME

BACKGROUND OF THE INVENTION

1. Field of the Invention

The present invention relates to an electrode of an n-type nitride semiconductor, a semiconductor device having the electrode, and a method of fabricating the same.

2. Description of the Prior Art

A gallium nitride based compound semiconductor (for example, GaN) functions as a p-type semiconductor if p-type impurities (Mg, Zn, Cd, Be, Li, etc.) are added, while functions as an n-type semiconductor if n-type impurities (Si, Sn, Ge, etc.) are added, and is used as a semiconductor layer of an optical device such as a blue light emitting diode, a laser diode, or a light receiving element.

The optical device has been required to improve its performance in respect of driving at low voltage and increasing in luminance. In order to realize the requirement, however, it is necessary to make contact of a semiconductor film with a metal film used as an electrode good. That is, good ohmic contact is required. The prior art of an electrode of an n-type gallium nitride based compound semiconductor is one having a structure in which titanium (Ti) and gold (Au) are laminated. The electrode is provided by electron beam evaporation, and is then subjected to heat treatment at a temperature of not lower than 600° C. in order to obtain good ohmic contact (see JP-A-7-254733, for example). Although an electrode using a structure in which titanium (Ti) and aluminum (Al) are laminated has been also proposed, the electrode is also provided by electron beam evaporation, and is then subjected to heat treatment at a temperature of approximately 600° C. in order to obtain good ohmic contact (see Appl. Phys. Lett. 70(1)6 January 1997 pp.57–59).

On the other hand, an example of an electrode of a p-type gallium nitride based compound semiconductor is one having a structure in which two types of metal thin films of nickel (Ni) and gold (Au) having higher conductive properties than those of nickel are laminated. The metal thin films are used as a transparent whole surface metal upon being caused to have transparency by decreasing the thickness thereof. Also in this case, the electrode is subjected to heat treatment at a temperature of approximately 400° C. in order to obtain good ohmic contact (see JP-A-7-94782, for example).

As described in the foregoing, the electrode of an n-type gallium nitride based semiconductor has conventionally required heat treatment at a temperature of not lower than 600° C. in order to obtain good ohmic contact. When the heat-treating temperature exceeds 600° C., however, nickel (Ni) and gold (Au) which are used as a transparent electrode of a p-type gallium nitride based semiconductor do not function as an electrode upon being inferior in conductive properties and higher in sheet resistance because gold on the upper layer does not partially exist by aggregation due to inferior wettability between gold and nickel. In order to make use of the function as a transparent electrode and obtain ohmic contact with an n-type electrode, therefore, a method of forming the n-type electrode, subjecting the n-type electrode to heat treatment, and then forming a transparent electrode has been employed.

When a device is produced by this method, however, p-type and n-type electrodes must be separately heat-treated. Moreover, the number of photolithographic processes is increased, resulting in complicated work.

SUMMARY OF THE INVENTION

The present invention has been made in view of the above-mentioned conventional problems and has for its object to provide an electrode making ohmic contact with an n-type nitride semiconductor without requiring heat treatment at high temperature, a semiconductor device having the electrode, and a method of fabricating the same.

An electrode of an n-type nitride semiconductor according to the present invention is characterized in that an aluminum layer is provided on an n-type nitride semiconductor, and a gold layer is laminated thereon with at least either one of a silicon layer and a nickel layer interposed therebetween.

An electrode of an n-type nitride semiconductor according to the present invention is characterized in that an aluminum layer and a silicon layer are provided in this order on an n-type nitride semiconductor, and a gold layer is laminated thereon through a refractory metal layer.

As the refractory metal layer, any one of nickel, platinum, titanium and molybdenum may be used.

By employing the above-mentioned electrode structure of a multi-layer film, an electrode making good ohmic contact with an n-type gallium nitride based semiconductor is obtained without requiring heat treatment at high temperature.

The aluminum layer is characterized in that it is formed in an island shape on the n-type nitride semiconductor.

A semiconductor device according to the present invention is characterized in that it has the above-mentioned electrode of the n-type nitride semiconductor.

The present invention provides a method of fabricating an electrode of an n-type nitride semiconductor, characterized in that an aluminum layer, a silicon layer, a nickel layer and a gold layer are provided in this order on an n-type nitride semiconductor, the electrode being formed at a temperature of 30 to 70° C. by electron beam evaporation.

The thickness of the aluminum layer may be not more than 10 nm.

The electrode may be formed on the n-type nitride semiconductor by a lift-off process.

According to the above-mentioned fabricating method, it is possible to form an electrode making good ohmic contact with the n-type nitride semiconductor. Further, the electrode can be prevented from being peeled by being formed using a lift-off process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the drawings.

Figure 1:
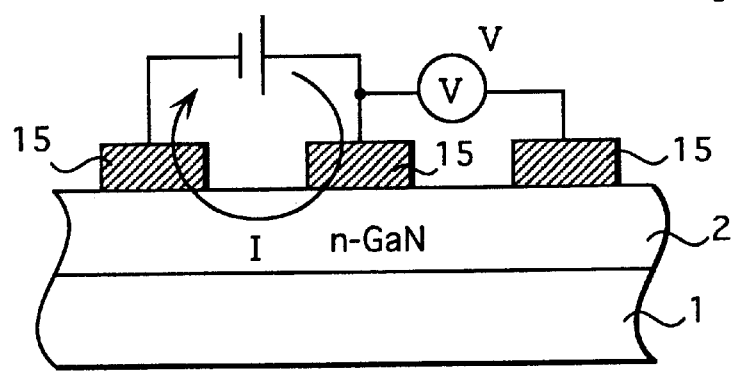
FIG. 1 is an explanatory view showing a device structure for measuring the contact resistance (Rc) of an n-type electrode in the present invention.

As shown in FIG. 1, an n-type GaN film 2 having a thickness of 3.9 μm, having a carrier concentration of ~$3 \times 10^{18} cm^{-3}$, and having a sheet resistance of 22 to 26 Ω/□ is formed on a sapphire substrate 1 by an MOCVD (Metal organic chemical vapor deposition) method. The n-type GaN film 2 is cleaned by a cleaning fluid of an HCl system, an $H_2SO_4$ system or a BHF system, after which an electrode 15 which is composed of a multi-layer film whose composition is varied is formed on the n-type GaN film 2 in order to obtain ohmic contact at room temperature by electron beam evaporation using a metal mask.

The n-type electrodes 15 having a diameter of φ170 μm are formed at a pitch of 250 μm on the n-type GaN film 2. The contact resistance Rc (=V/I) of the n-type electrode 15 was measured by a three-terminal method.

As examples of the n-type electrode 15 composed of the multi-layer film, the following four types of n-type electrodes are formed at room temperature by electron beam evaporation.

The first n-type electrode has a structure in which aluminum (Al) having a thickness of 30 nm is deposited on the side of an n-type GaN film 2, and gold (Au) having a thickness of 20 nm is laminated thereon. The second n-type electrode has a structure in which aluminum (Al) having a thickness of 6 nm is deposited on the side of an n-type GaN film 2, silicon (Si) having a thickness of 1 nm is provided thereon, and gold (Au) having a thickness of 20 nm is further laminated thereon. The third n-type electrode has a structure in which aluminum (Al) having a thickness of 6 nm is deposited on the side of an n-type GaN film 2, nickel (Ni) having a thickness of 2 nm is provided thereon, and gold (Au) having a thickness of 20 nm is further laminated thereon. The fourth n-type electrode has a structure in which aluminum (Al) having a thickness of 6 nm is deposited on the side of an n-type GaN film 2, silicon (Si) having a thickness of 1 nm and nickel (Ni) having a thickness of 6 nm are successively laminated thereon, and gold (Au) having a thickness of 20 nm is further laminated thereon. The thickness is a value observed by a quartz oscillator monitor during film formation.

The contact resistance of each of the above-mentioned four types of n-type electrodes was measured by the three-terminal method after deposition and after heat treatment at respective temperatures. The results are shown in Table 1. As the contact resistance, two values at the time of 1 mA and at the time of 10 mA are shown. The heat treatment was performed for three minutes in an atmosphere of nitrogen ($N_2$).

TABLE 1

| electrode material | Au/Al | Au/Si/Al | Au/Ni/Al | Au/Ni/Si/Al |
|---|---|---|---|---|
| thickness(nm) | 20/30 | 20/1/6 | 20/2/6 | 20/6/1/6 |
| V/I | Rc(1/10) | Rc(1/10) | Rc(1/10) | Rc(1/10) |
| after deposition | 27/18 | 24/19 | 21/13 | 11/10 |
| 200° C. | 41/21 | 22/20 | 14/13 | 21/16 |
| 300° C. | 26/17 | 16/15 | 12/12 | 13/12 |
| 400° C. | 14/13 | 13/13 | 14/13 | 12/12 |
| 500° C. | 7.6/7.4 | 9.6/9.5 | 9.4/9.3 | 9.2/9.1 |

The smaller the difference between the contact resistance at the time of 1 mA and the contact resistance at the time of 10 mA is and the smaller the absolute value therebetween is, the better ohmic characteristics become.

Table 2 shows the heat-treating temperatures and the results of evaluation of linearity of I–V characteristics in each of the above-mentioned electrode structures.

TABLE 2

| electrode material | after deposition | 200° C. | 300° C. | 400° C. | 500° C. |
|---|---|---|---|---|---|
| Au/Ni/Si/Al | ○ | Δ | ○ | ○ | ◎ |
| Au/Ni/Al | Δ | ○ | ○ | ○ | ◎ |
| Au/Si/Al | Δ | Δ | ○ | ○ | ◎ |
| Au/Al | Δ | ▲ | Δ | ○ | ◎ |

◎: linear, minimum contact resistance,
○: linear, (Rc10 / at 1 mA) > 0.9,
Δ : nonlinear, (Rc10 / at 1 mA) < 0.9,
▲ : nonlinear, (Rc10 / at 1 mA) < 0.6

As apparent from Table 1 and Table 2, when at least either one of a silicon (Si) layer and a nickel (Ni) layer is interposed between an aluminum (Al) layer and a gold (Au) layer, an n-type electrode having linear characteristics is obtained at a heat-treating temperature of not higher than 300° C. Consequently, an electrode structure of a multi-layer film in which an aluminum (Al) layer is provided on an n-type gallium nitride based semiconductor, and a gold (Au) layer is laminated thereon with at least either one of a silicon (Si) layer and a nickel (Ni) layer interposed therebetween is employed, to obtain an electrode making ohmic contact with the n-type gallium nitride based semiconductor without requiring heat treatment at high temperature. When the n-type GaN film 2 which has been subjected to heat treatment was examined, the diffusion of silicon (Si) from the electrode 15 was not observed.

Table 1 shows samples taken by growing the n-type GaN film 2 on the sapphire substrate 1, and forming the electrode 15 as it is by deposition, that is, producing the electrode 15 on the n-type GaN film 2 in a as-grown state. In the actual device, however, a p-type GaN film is grown on the n-type GaN film, and the p-type GaN film is etched away by R.I.E. (reactive ion etching), after which an electrode is formed. Therefore, results obtained by forming an electrode on an n-type GaN film etched by R.I.E. and measuring the contact resistance thereof are shown in Table 3. The R.I.E. conditions are etching gas $CF_4$ with a flow rate of 10 sccm (standard cubic centimeter) and etching gas $O_2$ with a flow rate of 2.5 sccm, power of 300 W, a period of 50 minutes, and a gas pressure of 3 Pa. GaN film was etched continually without cleaning the chamber in the etching equipment.

TABLE 3

| electrode material | Au/Ni/Si/Al | | Au/Ni/Si/Al | |
|---|---|---|---|---|
| thickness(nm) | 200/6/1/60 | | 300/6/1/6 | |
| substrate | as grown | afterR.I.E. | as-grown | afterR.I.E. |
| after deposition | 8.8/8.4 | 320/54 | 11/10 | 41/19 |
| 200° C. | 8.6/8.3 | 664/91 | 10/9.8 | 25/14 |
| 300° C. | 7.1/6.9 | 554/80 | 5.8/5.7 | 5.3/5.1 |
| 400° C. | 6.8/6.6 | 363/58 | 3.4/3.4 | 3.7/3.7 |
| 500° C. | 6.3/6.2 | 91/33 | 3.6/3.6 | 3.4/3.3 |

As the contact resistance Rc, two values at the time of 1 mA and at the time of 10 mA, which were measured by the above-mentioned three-terminal method, are shown. The thickness of the electrode is a value observed by a quarts oscillator monitor during film formation.

As apparent from Table 3, when the n-type GaN film is in an as-grown state, the contact resistance (Rc) of the electrode is not changed even if the thickness of aluminum (Al) is increased. When the n-type GaN film after R.I.E. is used, however, good ohmic characteristics are obtained by annealing at a temperature of not lower than 300° C. when the thickness of aluminum (Al) is 6 nm. On the other hand, good ohmic characteristics cannot be obtained even by annealing at a temperature of 500° C. when the thickness of aluminum (Al) is 60 nm. When the samples were observed by an SEM, aluminum (Al) adhered on the n-type GaN film in an island shape when the nominal thickness of aluminum (Al) is 6 nm, while continuously adhering on the n-type GaN film when the thickness of aluminum (Al) is 60 nm. When the n-type GaN film 2 which has been subjected to heat treatment was examined, the diffusion of silicon (Si) from the electrode was not observed.

Furthermore, the temperature at which the electrode composed of Au/Ni/Si/Al (200/6/1/6 nm) is deposited was changed, to measure ohmic characteristics. Good ohmic characteristics were obtained when the electrode was formed at a depositing temperature in the range of 30 to 700° C., while being inferior at a depositing temperature of 100° C. When the samples at this time were observed by an SEM, aluminum (Al) adhered on the n-type GaN film in an island shape when the depositing temperature is 30 to 70° C., while continuously adhering on the n-type GaN film when the depositing temperature is 100° C.

From the foregoing, it is considered that aluminum (Al) should adhere in an island shape in order to obtain good ohmic characteristics with n-type GaN film etched by R.I.E. This requires suitable control of the depositing temperature and the thickness of aluminum (Al). The results of the experiments showed that aluminum (Al) could adhere in an island shape by setting the thickness of Al to not more than 10 nm at a depositing temperature of 30 to 70° C.

In the case of the electrode having a laminated structure of Au/Ni/Si/Al, nickel (Ni) serves to prevent gold (Au) formed thereon from being diffused. Even if a refractory metal such as titanium (Ti), platinum (Pt) or molybdenum (Mo) is used in place of nickel (Ni) as a material performing the same function, it can be presumed that an electrode, which has the same effect, making ohmic contact with n-type GaN can be obtained.

The n-type GaN film 2 was then etched by changing R.I.E. gas, to examine the electrode characteristics of an n-type electrode formed on the surface thereof. As the electrode characteristics, the following two types of electrodes were formed on the same substrate and were subjected to heat treatment, to examine the relationship between the heat-treating temperature and the contact resistance. As the electrodes, an electrode obtained by depositing titanium (Ti) having a thickness of 30 nm Qn the side of the n-type GaN film 2 and laminating thereon aluminum (Al) having a thickness of 500 nm, an electrode obtained by depositing aluminum (Al) having a thickness of 6 nm on the side of the n-type GaN film 2 and successively laminating thereon silicon (Si) having a thickness of 2 nm, nickel (Ni) having a thickness of 10 nm and gold (Au) having a thickness of 200 nm were prepared.

As the respective samples, the n-type GaN film 2 was etched by replacing R.I.E. gas with $CF_4/H_2$ and $CF_4/O_2$, to form the above-mentioned two types of electrodes on the n-type GaN film 2. The respective characteristics of the electrodes were compared.

The contact resistance of each of the two types of n-type electrodes was measured after deposition and after heat treatment at various temperatures by the above-mentioned three-terminal method. The results thereof are shown in Table 4 and Table 5. The heat treatment was performed for ten minutes under an atmosphere of nitrogen ($N_2$). The R.I.E. conditions are etching gas $CF_4/H_2$ with a flow rate of 10 sccm/2.5 sccm and etching gas $CF_4/O_2$ with a flow rate of 10 sccm/2.5 sccm, power of 300 W, a period of 50 minutes, and a gas pressure of 3 to 4 Pa. Each sample was etched after cleaning the chamber.

As the contact resistance (Rc), two values at the time of 1 mA and at the time of 10 mA, which were measured by the three-terminal method, are shown. The sheet resistance (n-Rs:Ω/□) was measured by a four-terminal method at a current I of 10 mA and with probe spacing of 0.75 mm.

TABLE 4

| type of R.I.E. gas speed(nm/min) | $CF_4/O_2$ 21.5 | | | |
|---|---|---|---|---|
| electrode material | Al/Ti | | Au/Ni/Si/Al | |
| resistance | n-Rs | Rc(1 mA/10 mA) | n-Rs | Rc(1 mA/10 mA) |
| after deposition | 29.7 | 52/24 | 20.8 | 4.6/4.6 |
| 350° C. | 30.5 | 360/57 | 28.9 | 9.6/8.4 |
| 400° C. | 32.1 | 220/39 | 27.6 | 8.6/7.7 |
| 450° C. | 27.8 | 13/10 | 26.6 | 7.2/6.7 |
| 500° C. | 16.8 | 5.0/4.9 | 26.3 | 7.5/6.9 |
| 550° C. | 15.8 | 4.0/3.9 | 25.3 | 6.9/6.6 |
| 600° C. | 15.8 | 3.9/3.8 | 24.0 | 6.3/6.2 |

TABLE 5

| type of R.I.E. gas speed(nm/min) | $CF_4/H_2$ 17.3 | | | |
|---|---|---|---|---|
| electrode material | Al/Ti | | Au/Ni/Si/Al | |
| resistance | n-Rs | Rc(1 mA/10 mA) | n-Rs | Rc(1 mA/10 mA) |
| after deposition | 27.9 | 49/22 | 18.5 | 4.2/4.1 |
| 350° C. | 29.3 | 320/52 | 24.7 | 6.8/6.3 |
| 400° C. | 29.8 | 180/34 | 22.8 | 6.4/6.0 |
| 450° C. | 22.7 | 8.0/7.3 | 22.1 | 5.9/5.7 |
| 500° C. | 14.9 | 4.2/4.1 | 22.0 | 6.1/5.9 |
| 550° C. | 14.5 | 4.0/3.9 | 21.3 | 5.6/5.5 |
| 600° C. | 14.6 | 4.1/4.1 | 20.0 | 5.1/5.0 |

Figure 2:
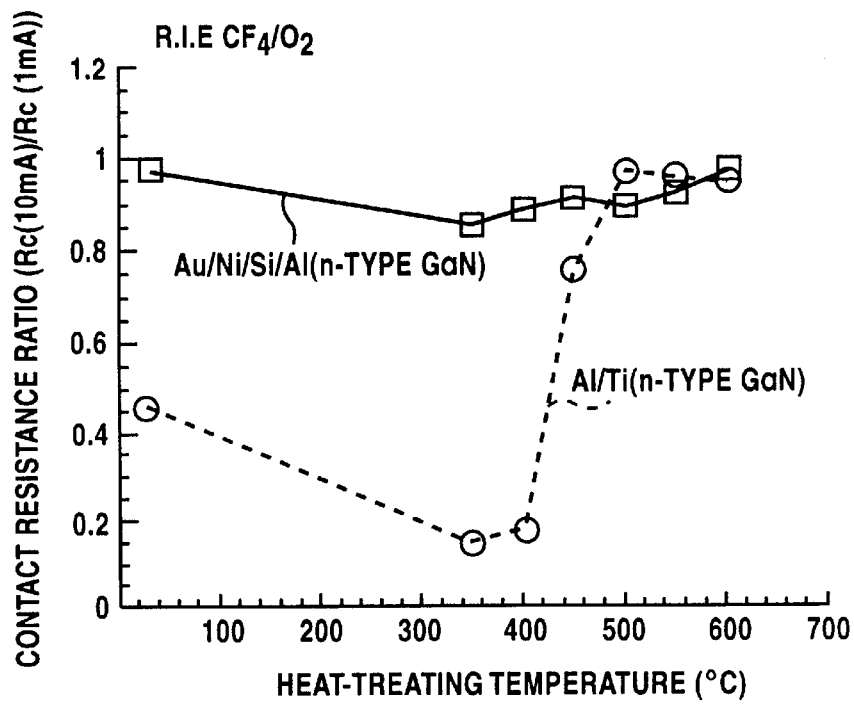
FIGS. 2 and 3 are characteristic views showing the relationship between the heat-treating temperature and the contact resistance of each of an n-GaN layer and an electrode layer after R.I.E. etching.
Figure 3:
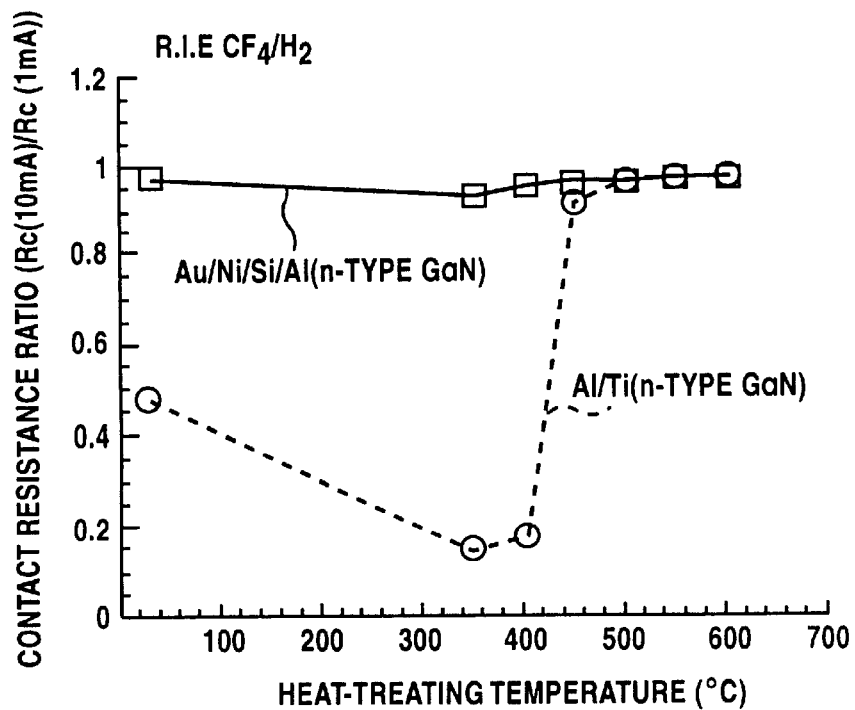

As can be seen from Table 4 and Table 5, in the electrode structure according to the present invention, better results are obtained in both the contact resistance and the sheet resistance, as compared with the conventional aluminum (Al) electrode in which titanium (Ti) is provided on the side of the n-type GaN film, at heat-treating temperatures of not higher than 450° C. FIG. 2 and FIG. 3 respectively show the relationships between the heat-treating temperature and the contact resistance ratio (Rc(10 mA)/Rc(1 mA)) in cases where different types of R.I.E. etching gas are used. As can be seen from the Tables, characteristics having better linearity are obtained in the electrode having the electrode structure according to the present invention, as compared with the conventional electrode, at a heat-treating temperature of not higher than 450° C.

As the R.I.E. etching gas, smaller values are obtained for both the sheet resistance n-Rs and the contact resistance Rc in a case where $CF_4/H_2$ is used, as compared with a case where $CF_4/O_2$ is used.

The comparison of the Rc values was made, as shown in Table 3, 4, and 5, in using Au/Ni/Si/Al electrode. While Rc values after deposition are smallest in Table 4 and 5, Rc values after deposition is largest in Table 3.

This seems because the experiment was made in the clean chamber condition after the chamber in etching equipment was cleaned. That is, the repetition of R.I.E. in the chamber supposedly causes attachment of residual of etching gas and impurities such as etched substances to the inside of the chamber. Furthermore, these substances attached to the inside of the chamber stick to the GaN layer surface when n-type GaN layer was etched, and consequently, as shown in Table 3, contact resistance between GaN layer and electrode has reduced.

In such case that substances were attached to the inside of the chamber in etching equipment, however, the present invention can realize reduction of contact resistance and good ohmic characteristics by annealing at the temperature as low as 300° C. Especially the present invention is very effective in quantity production in which etching is performed in succession.

FIGS. 4A to 4E are longitudinal sectional views showing the steps of a method of fabricating a blue LED chip employing the above-mentioned electrode structure of Au/Ni/Si/Al/(n-type GaN) as an n-type electrode. A method of fabricating the chip will be described using FIGS. 4A to 4E.

Figure 4A:
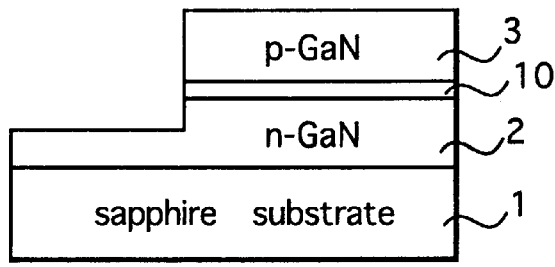
FIGS. 4A to 4E are longitudinal sectional views showing the steps of a method of fabricating a blue LED having an n-type electrode in the present invention.
Figure 4B:
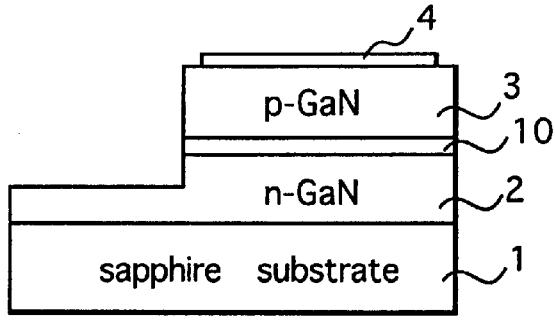

As shown in FIG. 4A, an n-type GaN layer 2 and a p-type GaN layer 3 are formed on a sapphire substrate 1 by an MOCVD method. A part of the p-type GaN layer 3 or the like is removed by mesa etching using R.I.E., to expose a part of the n-type GaN layer 2. A light emitting layer 10 composed of InGaN is formed between the n-type GaN layer 2 and the p-type GaN layer 3. As shown in FIG. 4B, a transparent electrode 4 composed of a laminated film of Ni (2 nm in thickness) and Au (4 nm in thickness) is formed by a method such as electron beam evaporation almost all over the surface of the p-type GaN layer 3 to be a surface where light emission is observed. In forming the transparent electrode 4, heat treatment is not performed. The program then proceeds to the step shown in FIG. 4C.

Figure 4C:
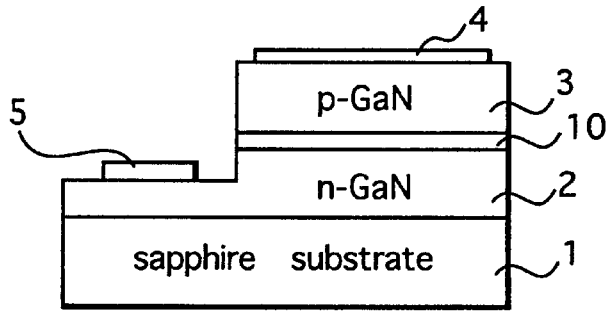

As shown in FIG. 4C, an n-type electrode 5 obtained by laminating aluminum (Al) having a thickness of 6 nm, silicon (Si) having a thickness of 1 nm, nickel (Ni) having a thickness of 6 nm and gold (Au) having a thickness of 200 nm on the surface of the n-type GaN layer 2 is formed by electron beam evaporation or the like. An example of the patterning of the n-type electrode 5 is patterning by etching or a lift-off process. As the patterning by etching, a laminated multi-layer film to be an electrode is deposited, and an electrode pattern is then formed by a photolithographic process, after which the electrode is formed by wet etching. The etching is performed using the following etchant. A mixed solution of iodine and potassium iodine is used for gold (Au), a nitric acid solution is used for nickel (Ni), a mixed solution of hydrofluoric acid and a nitric acid solution is used for silicon (Si), and a phosphoric acid solution is used as aluminum (Al). It was found that the electrode was easily peeled when the electrode was patterned by the above-mentioned etching. That is, in the electrode structure according to the present invention, the thickness of Al and Si is small, for example, approximately 6 nm, so that it is difficult to control the etching rate and judge the stop of etching. Al is etched using a solution other than the phosphoric acid solution, and is etched using an etchant for Si or Ni. This indicates that the electrode is easily peeled. In the electrode structure according to the present invention, it is preferable that the lift-off process is used for the patterning of the electrode. In the lift-off process, an overhang portion is formed on a resist film, and the above-mentioned multi-layer film to be an electrode is deposited thereon. The deposited film is cut by a step in the overhang portion, and an unnecessary portion, together with the resist film, is removed, thereby forming the electrode. According to this process, no etchant or the like is required, therfore the etching rate, the selectivity or the like for the other materials need not be considered. The electrode is not peeled. Therefore, the lift-off process is suitable for formation of the electrode composed of the multi-layer film.

After the n-type electrode 5 is thus formed, heat treatment (alloy) is performed for three minutes at a temperature of approximately 400° C., to obtain ohmic contact of the n-type electrode 5, and obtain ohmic contact of the above-mentioned transparent electrode 4. In the heat treatment, conductive properties and an adhesive force of the transparent electrode 4 already formed are not degraded. In the heat treatment, the flow rate of nitrogen gas is taken as 1.0 litters per minute.

Figure 4D:
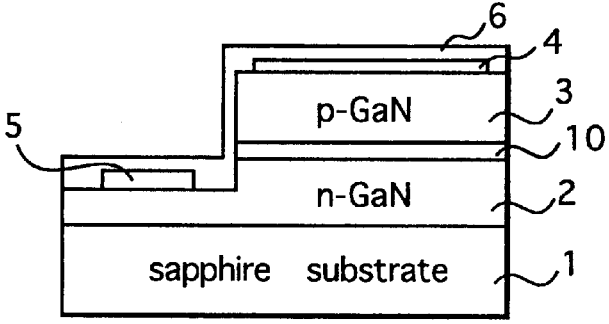
Figure 4E:
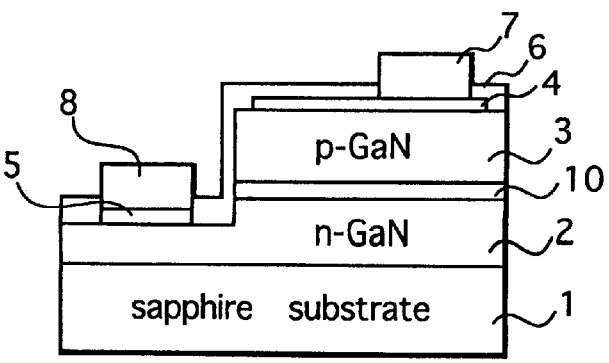

Thereafter, a protective film 6 composed of $SiO_2$, $Si_3O_4$, SiN, or the like is formed by spin-coating a coating film having fluidity and then baking the coating film, as shown in FIG. 4D, both electrode portions of the protective film 6 are opened, as shown in FIG. 4E, and pad electrodes 7 and 8 composed of nickel (Ni) having a thickness of approximately 30 nm and gold (Au) having a thickness of approximately 500 nm are then provided. Consequently, the blue LED chip is obtained.

According to the present invention, therefore, the n-type electrode 5 and the transparent electrode 4 can be simultaneously heat-treated, so that the steps can be simplified. Metals composing the n-type electrode 5 may, in some cases, be alloyed during heat treatment (alloy). It goes without saying that such a case is included in the present invention.

Although in the foregoing description, GaN is illustrated as a gallium nitride based compound semiconductor, the present invention is not limited to the same. For example, $Ga_XAl_{1-X}N$ (where $0 \leq X \leq 1$) or $In_XAl_YGa_{1-X-Y}N$ (where $0 \leq X \leq 1$ and $0 \leq Y \leq 1$) is also included. It goes without saying that the gallium nitride based compound semiconductor may be a nitride in a case where it contains no Ga, as can be seen from such formulas.

Although the blue LED chip was illustrated as a semiconductor device using the electrode, the present invention is not limited to the same. For example, the present invention can be also used for optical devices such as a phototransistor (particularly for a short wavelength) and a semiconductor laser. Further, the present invention is also applicable to devices (particularly for a high-temperature environment) such as an FET, a bipolar transistor, and a diode in addition to the optical devices.

As described in the foregoing, according to the present invention, it is possible to obtain an electrode making ohmic contact with an n-type gallium nitride based semiconductor without requiring heat treatment at high temperature.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electrode of an n-type nitride semiconductor, wherein an aluminum layer and a silicon layer are provided in this order on an n-type nitride semiconductor, and a gold layer is laminated thereon through a refractory metal layer.

2. The electrode according to claim 1, wherein
said refractory metal layer is selected from any one of nickel, platinum, titanium and molybdenum.

3. The electrode according to claim 1, wherein
said aluminum layer is formed in an island shape on the n-type nitride semiconductor.

4. The electrode according to claim 1, wherein
the thickness of said aluminum layer is not more than 10 nm.

5. The electrode of claim 1, wherein the n-type nitride semiconductor is an n-type gallium nitride-based compound semiconductor.

6. An electrode of an n-type nitride semiconductor, wherein
an aluminum layer is provided in an island shape on an n-type nitride semiconductor, and a gold layer is laminated thereon with at least either one of a silicon layer and a nickel layer interposed therebetween.

7. The electrode according to claim 6, wherein
the thickness of said aluminum layer is not more than 10 nm.

8. The electrode of claim 6, wherein the n-type nitride semiconductor is an n-type gallium nitride-based compound semiconductor.

9. A semiconductor device, wherein an n-type electrode constructed by successively laminating an aluminum layer, a silicon layer, a refractory metal layer and a gold layer is provided on an n-type nitride semiconductor.

10. The semiconductor device according to claim 9, wherein
said refractory metal layer is selected from any one of nickel, platinum, titanium and molybdenum.

11. The semiconductor device according to claim 9, wherein
said aluminum layer is formed in an island shape on the n-type nitride semiconductor.

12. The semiconductor device according to claim 9, wherein
the thickness of said aluminum layer is not more than 10 nm.

13. The semiconductor device according to claim 9, wherein
said semiconductor device is an optical device.

14. The semiconductor device of claim 9, wherein the n-type nitride semiconductor is an n-type gallium nitride-based compound semiconductor.

15. A semiconductor device, wherein
an n-type electrode formed by laminating a gold layer on an aluminum layer formed in an island shape with at least either one of a silicon layer and a nickel layer interposed therebetween is provided on an n-type nitride semiconductor layer.

16. The semiconductor device according to claim 15, wherein the thickness of said aluminum layer is not more than 10 nm.

17. The semiconductor device according to claim 15, wherein
said semiconductor device is an optical device.

18. The semiconductor device of claim 15, wherein the n-type nitride semiconductor layer is an n-type gallium nitride-based compound semiconductor layer.

* * * * *